United States Patent [19]

Dijkmans et al.

[11] Patent Number: 4,608,502

[45] Date of Patent: Aug. 26, 1986

[54] I²L GATE CIRCUIT ARRANGEMENT HAVING A SWITCHABLE CURRENT SOURCE

[75] Inventors: Eise C. Dijkmans, Eindhoven, Netherlands; Wilhelm Graffenberger; Ernst A. Kilian, both of Hamburg, Fed. Rep. of Germany

[73] Assignee: U.S. Philips Corporation, New York, N.Y.

[21] Appl. No.: 504,199

[22] Filed: Jun. 14, 1983

[30] Foreign Application Priority Data

Jun. 16, 1982 [DE] Fed. Rep. of Germany ....... 3222607

[51] Int. Cl.⁴ .................... H03K 17/56; H03K 19/088
[52] U.S. Cl. .................................... 307/243; 307/240; 307/296 R; 307/456
[58] Field of Search ................... 307/247 R, 456, 240, 307/243, 296 R

[56] References Cited

U.S. PATENT DOCUMENTS

| 3,526,785 | 9/1970 | Biri | 307/243 |
| 4,037,118 | 7/1977 | Sieborger et al. | 307/296 R |
| 4,203,042 | 5/1980 | LeCan et al. | 307/243 |
| 4,317,050 | 2/1982 | Wine | 307/243 |
| 4,349,750 | 9/1983 | Gearts | 307/243 |

Primary Examiner—Stanley D. Miller
Assistant Examiner—B. P. Davis
Attorney, Agent, or Firm—Robert T. Mayer; Steven R. Biren

[57] ABSTRACT

The invention relates to a circuit arrangement having several signal paths which can be activated by a switchable current source. For the current source, use is made of I²L gates whose injector connections are combined in two groups. When a switch-over is made from one signal path to another, a decreasing current is applied to the injector connection of the I²L gate connected to one signal path while an increasing current is applied to the corresponding connection of the I²L gate associated with the other signal path.

6 Claims, 8 Drawing Figures

$I^2L$ GATE CIRCUIT ARRANGEMENT HAVING A SWITCHABLE CURRENT SOURCE

BACKGROUND OF THE INVENTION

The invention relates to a circuit arrangement comprising several signal paths which are formed by active circuits and via which signals of different level are applied to a common output, each signal path being activatable by a switchable current source.

A circuit arrangement of this general kind is known from DE-AS No. 25 06 034. However, the common output is connected to different signal sources via the various signal paths, so that the circuit arrangement acts as a signal source switch. However, it is in principle also possible to derive the signals to be applied via the various signal paths from a common signal source, but with a different amplitude or a different frequency response such as is known from DE-OS No. 30 37 986.

Due to the inevitable tolerances in the manufacture of the active circuits serving as signal paths, offset voltages may occur during switching over, said offset voltages causing a slight variation of the output d.c. voltage in reaction to the switch-over. This variation is reproduced as a click by a connected loudspeaker.

SUMMARY OF THE INVENTION

It is the object of the invention to construct a circuit arrangement of the kind set forth above so that the clicks thus produced are avoided.

This object is achieved by means of the following circuit arrangement:

(a) each current source is formed by at least one $I^2L$ gate, (b) the $I^2L$-gates are divided between a first group and a second group, the injector connections of the first group being connected to a first junction point while the injector connections of the second group are connected to a second junction point, (c) the control inputs of the $I^2L$ gates are driven so that when a switch-over source from one signal path to another signal path, two $I^2L$ gates, each of which is associated with one of the signal paths and with one of the groups, can conduct current at least during a transition phase, and (d) the junction points are chosen so that the output currents of the two $I^2L$ gates vary continuously and in the opposite sense during the transition phase.

The current for the activation of a signal path is thus supplied by an $I^2L$ gate connected thereto. An $I^2L$ gate is to be understood to mean hereinafter a circuit which is based on the well-known integrated injection logic principle and which consists of an inverter and an injector. The inverter is a vertical npn-transistor which is driven in inverted form and which comprises at least one collector zone which forms the output of the $I^2L$ gate. In the semi-conductor substrate a p-type conductive region is formed in the vicinity of this transistor structure in order to form, in conjunction with the emitter zone and the base zone of the inverter, a lateral pnp-transistor or the so-called injector, the collector zone of the injector being formed by the base zone while the base zone of the injector is formed by the emitter zone of the inverter. The output current of the $I^2L$ gate is determined by the current applied to the injector connection. Whether or not this output current flows depends on the signal on the control input of the $I^2L$ gate which is formed by the base of the inverter. $I^2L$ gates of this kind are known ("see Electronics", Feb. 6, 1975, pages 83 to 90, notably FIG. 2, and "Valvo-Berichte", Band XVIII, 1974, pages 215 to 226, notably FIGS. 1 and 5).

When a switch-over occurs from one signal path to another, in accordance with the invention a decreasing current is applied to the injector connection of the activated $I^2L$ gate of the previously-conductive signal path belonging to one group during the transition phase while an increasing current is applied to the $I^2L$ gate of the other signal path belonging to the other group, so that a gradual transition is achieved which cannot become audible via a loudspeaker receiving the output signal of the circuit arrangement.

For optimum operation of the signal path activated, i.e. the active circuit forming this path, the current supplied by the $I^2L$ gate must have a given value. However, with a constant injector current the output current of an $I^2L$ gate fluctuates substantially due to the fact that the current amplification factors of the inverter and the injector of an $I^2L$ gate are subject to substantial manufacturing tolerances. However, in a further embodiment in accordance with the invention, a substantially constant output current is achieved because the first and the second junction point are connected to the output of a first and a second amplifier as well as to the injector connection of a first and a second reference $I^2L$ gate, respectively, the output of which is connected to the input of the first and the second amplifier, there being provided a current source arrangement which applies currents which vary in an opposite sense to the inputs of the two amplifiers during the transition phase.

The (first and second) amplifiers ensure that the output current of the associated $I^2L$ gate corresponds to the current supplied by the current source arrangement. Consequently, depending on the manufacturing tolerances, the voltage on the output of the amplifier, i.e. on the injector connection of the associated reference gate or on the associated junction point, assumes a value such that the output current of the reference $I^2L$ gate assumes the required value. Because the other $I^2L$ gates provided on the same semiconductor substrate have substantially the same property, the output current thereof corresponds to that of the $I^2L$ gate.

BRIEF DESCRIPTION OF THE DRAWING

The invention will be described in detail hereinafter with reference to the drawings, in which.

DESCRIPTION OF THE PREFERRED EMBODIMENTS

Figure 1:
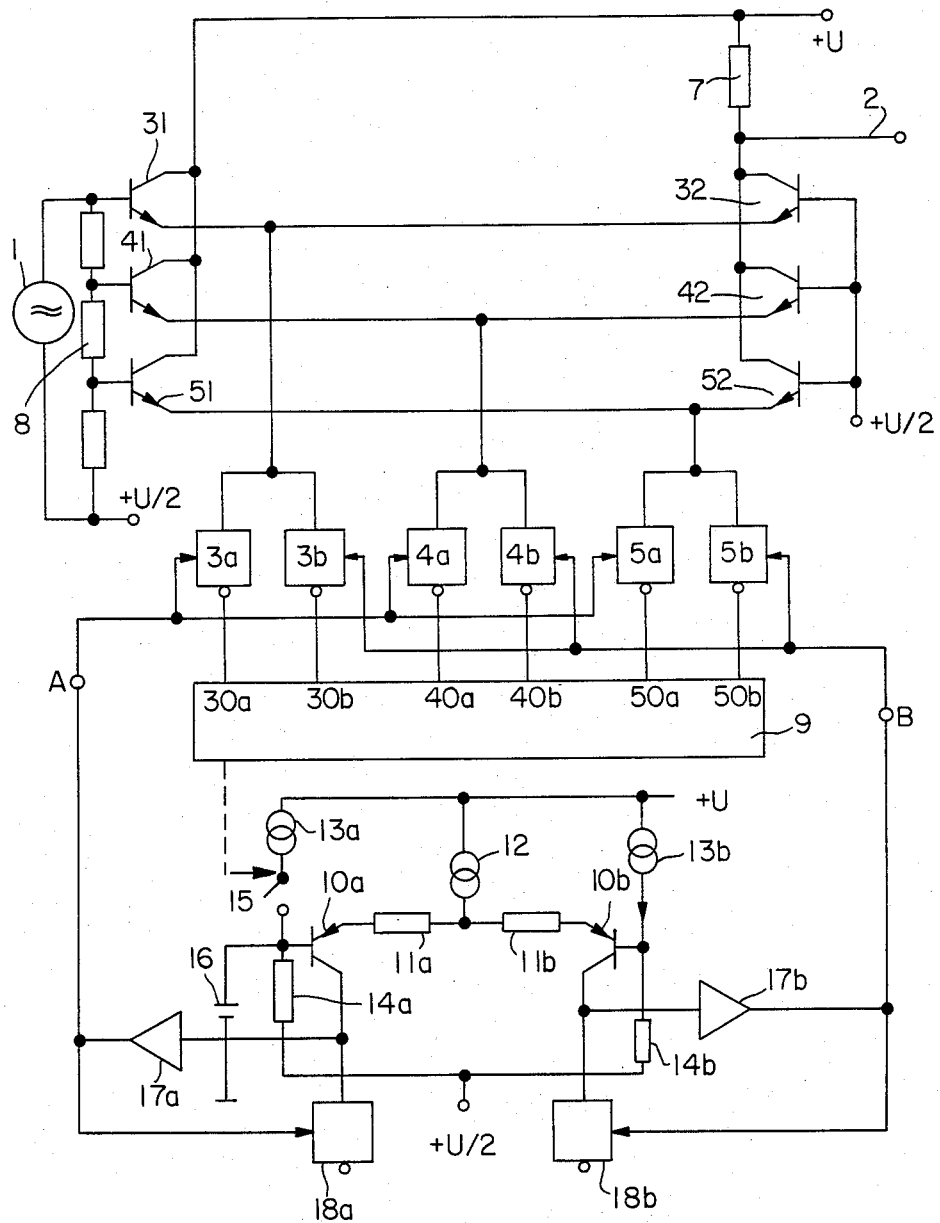
FIG. 1 shows an embodiment in accordance with the invention.

The circuit shown in FIG. 1 can act as a volume control in an audio amplifier and comprises a large number of signal paths (for the sake of clarity, only three of such paths are shown in the drawing) via which signals of different amplitude can be applied from a signal source 1 to a common output 2. Each signal path may comprise a differential amplifier whose d.c. supply current is switched on and off as disclosed in German DE-AS No. 25 06 034. Each of the differential amplifiers forming the signal paths is formed by an emitter-coupled npn transistor pair in the present embodiment. The first transistor pair comprises a transistor 31 whose base is connected to one connection of the signal source 1 whose other connection carries a suitable potential (+U/2). The collector of the transistor 31 is connected to a positive supply voltage (+U), its emitter being connected to the emitter of a transistor 32 whose collector is connected to the supply voltage (+U) via a resistor 7, the junction of the collector and the resistor forming the common output 2. The second transistor pair comprises a transistor 41 whose base is connected to a branch of a voltage divider 8 which is connected to the signal source 1, its emitter being connected to the emitter of a transistor 42 whose collector is connected to the common output 2. The third transistor pair is formed by the transistors 51 and 52 and is connected in exactly the same way as the other transistor pairs, the only difference being that the base of the transistor 51 is connected to the branch of the voltage divider carrying the lowest signal voltage. The bases of the transistors 32, 42 and 52 are connected to a suitble direct voltage (+U/2) and the collectors of the transistors 31, 41 and 51 are interconnected.

Which of the three signal paths is active depends on which of the three transistor pairs receives an emitter current. To this end, switchable current sources are included in the emitter leads of the transistor pairs. The current source for the transistor pair 31, 32 is formed by a first I$^2$L gate 3a and a second I$^2$L gate 3b whose outputs are connected to one another and to that of the emitter lead of the transistors 31 and 32. Similarly, the switchable current source for the transistor pair 41, 42 is formed by the two I$^2$L gates 4a and 4b and the current source for the transistor pair 51, 52 is formed by the two I$^2$L gates 5a and 5b. The injector connections of the I$^2$L gates 3a, 4a and 5a are connected to a first junction point A, while the injector connections of the I$^2$L gates 3b, 4b and 5b are connected to one another and to a second junction point B. Whether or not one of the I$^2$L gates carries a current which then flows from the ground connection (not shown) of the I$^2$L gate to the emitter connections of the transistors depends on the signals on the outputs 30a to 50b of a logic circuit 9 which is preferably also constructed according to the I$^2$L technique, said outputs being connected to the control inputs of the I$^2$L gates 3a to 5b: when the control input of the I$^2$L gate (formed by the base electrode of its inverter) carries the same potential as the emitter of the inverter (usually ground), the output current is zero, because the base-emitter path of the inverter is short-circuited; however, in the absence of such a short-circuit (open control input), a current whose value is determined by the operating potential on, or the current through, the junction points A and B can flow via the output of the I$^2$L gate.

Thus, if for example the I$^2$L gate 3b is rendered conductive by the signal on the output 30b of the logic circuit 9, a current flows through the transistors 31 and 32 which depends on the potential at point B or on the current through point B. The same is applicable to the transistors 41 and 42 when, for example the I$^2$L gate 4a carries a current, or for the transistors 51 and 52 when, for example, the I$^2$L gate 5b carries a current.

Because the transistor pairs 31, 32 and 41, 42, and 51, 52 cannot be identical, a switch-over from one signal path to another is accompanied by potential jumps which may become audible as annoying noise, notably in the absence of an input signal.

In accordance with the invention, the potential at the junction points A and B is changed in an opposite sense in the case of a switch-over from one signal path to another so that the previously conductive transistor pair (for example, 31, 32) receives a current which decreases to zero via the gate 3b, while an increasing current is applied (via the gate 4a) to the subsequently conductive transistor pair (for example 41, 42), the sum of the two currents preferably remaining at least substantially constant. The gates 3a to 5b must then be controlled by the logic circuit so that upon the switch-over from one signal path to another an I$^2$L gate is activated (for example, 4a) whose injector connection is connected to a junction point other than the injector connection of the I$^2$L gate activated before the switch-over (for example, 3b). Moreover, at least during the transition phase both gates must draw currents (varying in an opposite sense). Consequently, the signal amplitude as well as the d.c. voltage potential on the common output 2 continuously changes during the switch-over from one signal path to another, so that annoying noises will no longer be reproduced by a connected loudspeaker.

In order to generate the two operating potentials at the points A and B which vary in an opposite sense, or the currents which vary in an opposite sense via the points A and B, there is provided a current source arrangement which comprises two outputs, two amplifiers, two reference I$^2$L gates and a switchable RC-combination.

The current source arrangement comprises two transistors 10a and 10b whose emitters are interconnected via two equally large resistors 11a and 11b and are also connected to a d.c. source 12. The distribution of the d.c. current supplied by the d.c. source 12 between the two transistors 10a and 10b depends on the base voltage of the two pnp transistors 10a and 10b. The base of the transistor 10b is connected to a positive d.c. voltage (+U) via a d.c. source 13b and, via a resistor 14b, to a lower positive d.c. voltage (+U/2). The base of the transistor 10a is connected to the positive supply voltage via the series connection of a d.c. source 13a which supplies a current which equals that supplied by the source 13b, and a switch 15 which is controlled by the logic circuit 9, said base also being connected to the lower positive voltage (+U/2) via a resistor 14a whose value is twice as large as the value of the resistor 14b. The base is also connected to ground via a capacitor 16.

In the open position of the switch 15, as shown in FIG. 1, the base potential on the base of the transistor 10b is more positive than the base potential of the transistor 10a by an amount equal to the voltage drop across the resistor 14b caused by the d.c. current of the d.c. source 13b. Consequently, the complete current from the d.c. source 12 flows via the transistor 10a. When the switch 15 is closed, the capacitor 16 is charged, the base voltage of the transistor 10a then becoming increasingly more positive until it is more positive with respect to the voltage on the base of the transistor 10b by the same amount by which it was previously more negative (i.e. in the open position of the switch) than the base potential of the transistor 10b. This continuous transition of the transistor 10a from the conductive to the blocked state is accompanied by an exponential decrease of the collector current of the transistor 10a to the value zero and a corresponding increase of the collector current through the transistor 10b.

When the switch 15 is subsequently opened again, the transistor 10a becomes continuously conductive and, consequently, the transistor 10b becomes blocked, the collector currents then exponentially increasing and decreasing again, respectively. During a transition phase after the opening or closing of the switch 15 which is determined in first instance by the time constant of the time element consisting of the capacitor 16 and the resistor 14a, the output currents supplied by the current source arrangement (the collector currents of the transistors 10a and 10b) thus vary continuously.

Two auxiliary circuits ensure that the potentials at the junction points A and B change so that the output currents of the I²L gates whose injector connections are connected to these junction points exhibit the same variation as the collector currents of the transistors 10a and 10b. Each of the two auxiliary circuits consists of an amplifier 17a, 17b, respectively, whose input is connected to the collector of the transistor 10a, 10b, respectively, and to the output of a reference I²L gate 18a, 18b, respectively. The output of the amplifier 17a, 17b is connected to the junction point A, B, respectively, and to the injector connection of the reference I²L gate 18a, 18b respectively, so that a control circuit is obtained which ensures that the output current of the I²L gate 18a, 18b essentially corresponds to the collector current of the transistors 10a, 10b, respectively.

Figure 2:
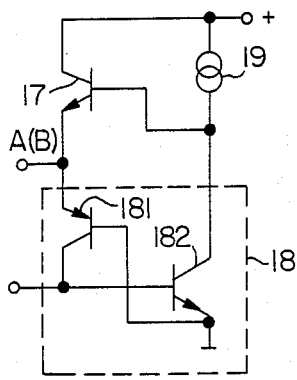
FIG. 2 shows the construction of an amplifier and a reference $I^2L$ gate.

The operation of the auxiliary circuit will be described in detail hereinafter with reference to the detailed circuit diagram shown in FIG. 2.

The reference I²L gate 18 (a or b) includes an npn transistor whose emitter is connected to ground and which preferably comprises several interconnected collectors which constitute the output of the I²L gate. The control input formed by the base of the inverter always remains open in the reference gates, so that current can always flow. This current is supplied by an injector which is formed by a pnp transistor 181 whose collector is connected to the base and whose base is connected to the emitter of the inverter transistor 182. The emitter of this transistor represents the injector connection of the I²L gate and is connected to one of the junction points A or B and to the output of the amplifier 17 (a or b) which is in this case formed by the emitter of an npn transistor having a high current amplification factor. The collector of this transistor is connected to a positive supply voltage, its base being connected to the output of the I²L gate as well as to the collector of the transistor 10a, 10b, respectively, which is symbolized by a current source 19 in FIG. 2. Depending on the tolerances of the current amplification factor of the injector 181 and the inverter 182, the potential on the emitter of the transistor 17, i.e. on the junction point A or B, always assumes a value such that the output current of the reference I²L gate is approximately equal to the current supplied by the current source 19, i.e. the collector current of the transistor 10a or 10b. A circuit of this kind is known in principle from DE-OS No. 28 37 476, notably from FIG. 3.

Because the reference gates 3a, 4a and 5a, 3b, 4b and 5b are formed on the same semiconductor substrate as the reference I²L gates 18a, 18b and because they have the same construction, they also carry the same output current as the latter, because their injector connections are connected to the associated junction point A or B like the injector connection of the reference gates, if they are not blocked by the logic circuit 9. Consequently, the currents applied to the emitters of the transistor pairs 31 to 52 also increase or decrease in the same manner as the collector currents of the transistors 10a and 10b.

Figure 3A:
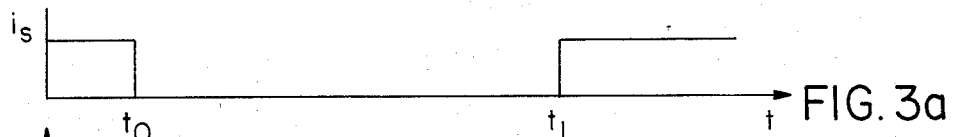
FIGS. 3a to 3f show the signals at various points in the circuit shown in FIG. 1 as a function of time.

The operation of the circuit shown in FIG. 1 will be described with reference to the time diagrams of FIG. 3a in the case of amplitude decrease on the common output 2.

It is assumed that the switch 15 is closed (has already been closed for a prolonged period of time) at a given instant. The transistor 10a is then blocked while the transistor 10b is conductive. This is illustrated in FIG. 3a which shows the variation in time of the current via the switch 15. If no current flows through the switch, the switch is opened; when a current flows via the switch, the switch is closed.

Figure 3B:
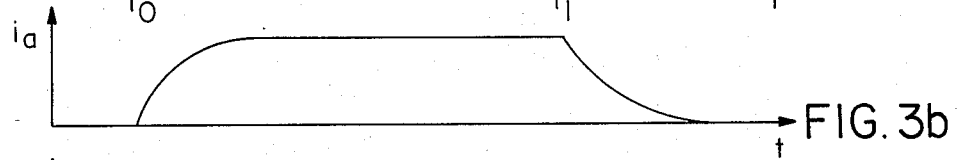
Figure 3C:
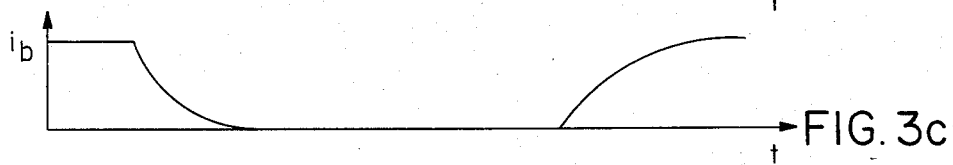
Figure 3D:
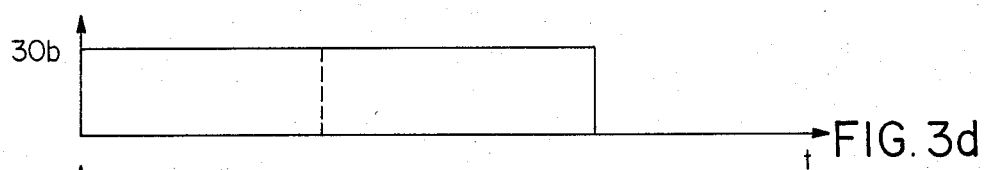

FIG. 3b shows the variation in time of the current $i_a$ on the output of the reference gate 18a. This current equals zero at the relevant instant, because the collector current of the transistor 10a is also zero. FIG. 3c shows the variation in time of the output current $i_b$ of the reference I²L gate 18b. This current has reached its maximum value at the relevant instant. When it is also assumed that only the gate 3b of the I²L gates coupled to the junction point B is controlled on the associated control input 30b by the logic circuit so that it can conduct an output current, a current flow only via the I²L gate 3b. The switching state on the output 30b follows from FIG. 3d, in which a signal value other than zero indicates that the associated I²L gate is conductive, this gate being blocked in the other case. In this stage only the signal path formed by the transistors 31 and 32 is active. The amplitude on the output 2 is maximum.

Figure 3E:
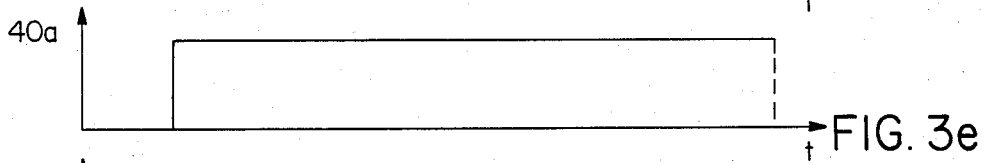
Figure 3F:
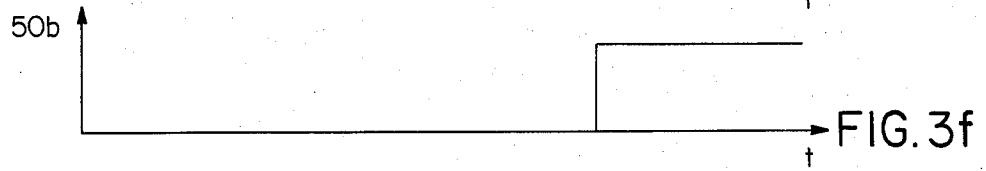

If the amplitude is to be reduced at the instant $t_0$, the logic circuit 9 performs two functions: it switches over the switch, 15, thus opening this switch and varies the potential on the control input 40a so that the associated I²L gate 4a can supply an output current (see FIG. 3e). The gate 3b conducting current thus far remains conductive (for the time being). The closing of the switch causes an exponential decrease of the output current of the reference I²L gate 18b to the value zero and a corresponding increase of the output current of the reference I²L gate 18a in the opposite sense. Consequently, the current through the I²L gate 3b decreases in the same way as the current $i_b$ and the current through the reference gate increases in the same way as the current $i_a$. At the end of this transistion phase, having a duration in the order of milliseconds (for example, 30 ms), the transistor pair 41 and 42 is also conductive and the ammplitude on the output is accordingly lower. During the transition phase a gradual decrease of the amplitude and a gradual potential shift take place (at least if offset voltages are present). The potential at the output 30b of the logic circuit 9 cannot change before the end of the transition phase in order to block the I²L gate 3b as denoted by a broken line in FIG. 3d.

When the volume is further reduced at the instant $t_1$, the logic circuit 9 again performs two functions: it switches over the switch 15, i.e. it closes the switch, and changes the potential on the control input 50b so that the associated I²L gate can carry current. No later than this instant the signal on the output 30b must have changed so that the I²L gate 3b can no longer produce an output current.

Due to these steps, the current $i_a$ decreases again while the current $i_b$ increases again so that the current applied to the emitter pair 41, 42 via the I²L gate 4a gradually decreases, while the current applied to the transistor pair 51, 52 increases until at the end of the transition phase only the transistors 51 and 52 are conductive, the output signal on the common output 2 then having reached its minimum amplitude.

If the volume is to be quickly increased again at a later instant, the transistor pair 31, 32 can be turned on without the transistor pair 41, 42 being meanwhile activated. In that case, however, the I²L gate 3a must be activated. When the volume is subsequently reduced again, the I²L gates 4b and 5a successively conduct current.

However, if the transistor pair 41, 42 is also turned on during the increasing of volume, first the I²L gate 4a conducts and subsequently the I²L gate 3b. In that case the I²L gates 3a, 4b and 5a are not at all necessary and each signal path comprises only one I²L gate (3b, 4a, 5b, respectively). The number of I²L gates is thus halved; however, in that case the signal paths can no longer be activated in an arbitrary sequence but only so that after a signal path whose current is supplied by an I²L gate whose connection is connected to the junction point A, only a signal path is activated whose current is supplied by an I²L gate which is connected to the junction point B and vice versa.

In that case it is advantageous to connect the injector connections of the I²L gates which are coupled to the signal paths alternately to the one and to the other junction point in the order of magnitude of the input signals on the signal paths as in the described embodiment. Therefore, the injector connections of the I²L gates which are connected to the signal paths carrying the largest input signal, the largest input signal but two, the largest input signal but four etc. should in general be connected, for example, to the junction point A, while the I²L gates associated with the signal paths carrying the largest input signal but one, the largest input signal but three, the largest input signal but five etc. should be connected to the junction point B.

What is claimed is:

1. A circuit arrangement comprising a plurality of signal paths which are formed by active circuits and by means of which signals of different levels are applied to a common output, each signal path being activatable by a switchable current source, characterized in that:
   (a) each current source is formed by at least one I²L gate (3a to 5b);
   (b) the I²L gates are divided between a first group and a second group, the injector connections of the first group being connected to a first junction point (A) while the injector connections of the second group are connected to a second junction point (B);
   (c) the control inputs of the I²L gates (3a to 5b) are driven so that when a switch-over occurs from one signal path to another signal path, two I²L gates, each of which is associated with one of the signal paths and with one of the groups (for example, 3b, 4a), can conduct current at least during a transition phase; and
   (d) the junction points (A, B) are chosen so that the output currents of the two I²L gates vary continuously and in the opposite sense during the transition phase.

2. A circuit arrangement as claimed in claim 1, characterized in that with each signal path there is associated only one I²L gate, the associated I²L gates alternately belonging to the first group and the second group in the order of magnitude of the input amplitude of the signal paths.

3. A circuit arrangement as claimed in claim 1, characterized in that each current source is formed by two I²L gates (3a, 3b to 5a, 5b) which belong to both groups and at least one of which is conductive during said transition phase.

4. A circuit arrangement as claimed in claim 1, 2 or 3, characterized in that the first and the second junction point (A, B) are connected to the output of a first and a second amplifier (17a, 17b) and to the injector connection of a first and a second reference I²L gate (18a, 18b), respectively, the output of which is connected to the input of the first and the second amplifier, a current source arrangement being provided (10a to 14a, 10b to 14b) which supplies the inputs of the two amplifiers with currents which vary in an opposite sense during the transition phase.

5. A circuit arrangement as claimed in claim 4, characterized in that the current source arrangement comprises an emitter-coupled transistor pair (10a, 10b) whose common emitter lead includes a constant current source (12) and whose base difference voltage is determined by at least one RC-element (14a, 16).

6. A circuit arrangement as claimed in claim 4, characterized in that a transistor (17) having a high current amplification factor is used as the amplifier, its base being connected to the output of the associated reference I²L gate while its emitter is connected to the injector connection of the associated reference I²L gate.

* * * * *